United States Patent [19]

Berrier et al.

[11] Patent Number: 5,045,840
[45] Date of Patent: Sep. 3, 1991

[54] DEVICE FOR SENSING CONTINUITY IN A CIRCUIT HAVING AN OPEN CIRCUITED APPARATUS

[75] Inventors: Gene C. Berrier, Fort Worth, Tex.; Wolf S. Landmann, Fair Lawn, N.J.

[73] Assignee: Benz Companies, Inc., Fort Worth, Tex.

[21] Appl. No.: 362,842

[22] Filed: Jun. 6, 1989

[51] Int. Cl.$^5$ ............................................. G08B 21/00
[52] U.S. Cl. .................................. 340/652; 340/514; 340/458
[58] Field of Search ............... 340/652, 641, 458, 514; 324/510

[56] References Cited

U.S. PATENT DOCUMENTS

| | | | |
|---|---|---|---|
| 3,955,183 | 5/1976 | McBrian | 340/514 |
| 3,963,981 | 6/1976 | Vis | 324/510 |
| 4,086,570 | 4/1978 | Wakasa et al. | 340/652 |
| 4,166,243 | 8/1979 | West et al. | 340/652 |
| 4,219,805 | 8/1980 | Magee et al. | 340/631 |
| 4,354,180 | 10/1982 | Harding | 340/641 |
| 4,667,187 | 5/1987 | Volk et al. | 340/458 |

OTHER PUBLICATIONS

Motorola Semiconductors advance information, "MC6802 Micrprocessor with Clock and RAM", 3/91.

Primary Examiner—Donnie L. Crosland
Assistant Examiner—Jill Jackson
Attorney, Agent, or Firm—Geoffrey A. Mantooth

[57] ABSTRACT

The two wire device tests the continuity of conductors in a monitoring circuit having an open circuited apparatus. The device has a switch which is controlled by a sequencer and a clock. Upon the application of power, the device is energized if the continuity of the conductors is present. The clock provides a train of pulses that alternately opens and closes the switch. When the switch is closed, continuity across the conductors is provided to illuminate an indicator lamp. When the switch is open, a power storage unit charges from the monitoring circuit power supply. The power storage unit provides operating power to the sequencer and the clock. The output of the clock has a long duty cycle so that the time when the switch is open is very brief, thus causing the lamp to be perceived by a human as unaffected. The sequencer counts the number of oscillations produced by the clock and when a predetermined number has occurred, turns off the clock and leaves the switch open. In another aspect, the circuit has parallel branches with a device on each branch. The devices communicate with each other on the conductors to determine if continuity exists in each branch before illuminating the lamp.

16 Claims, 4 Drawing Sheets

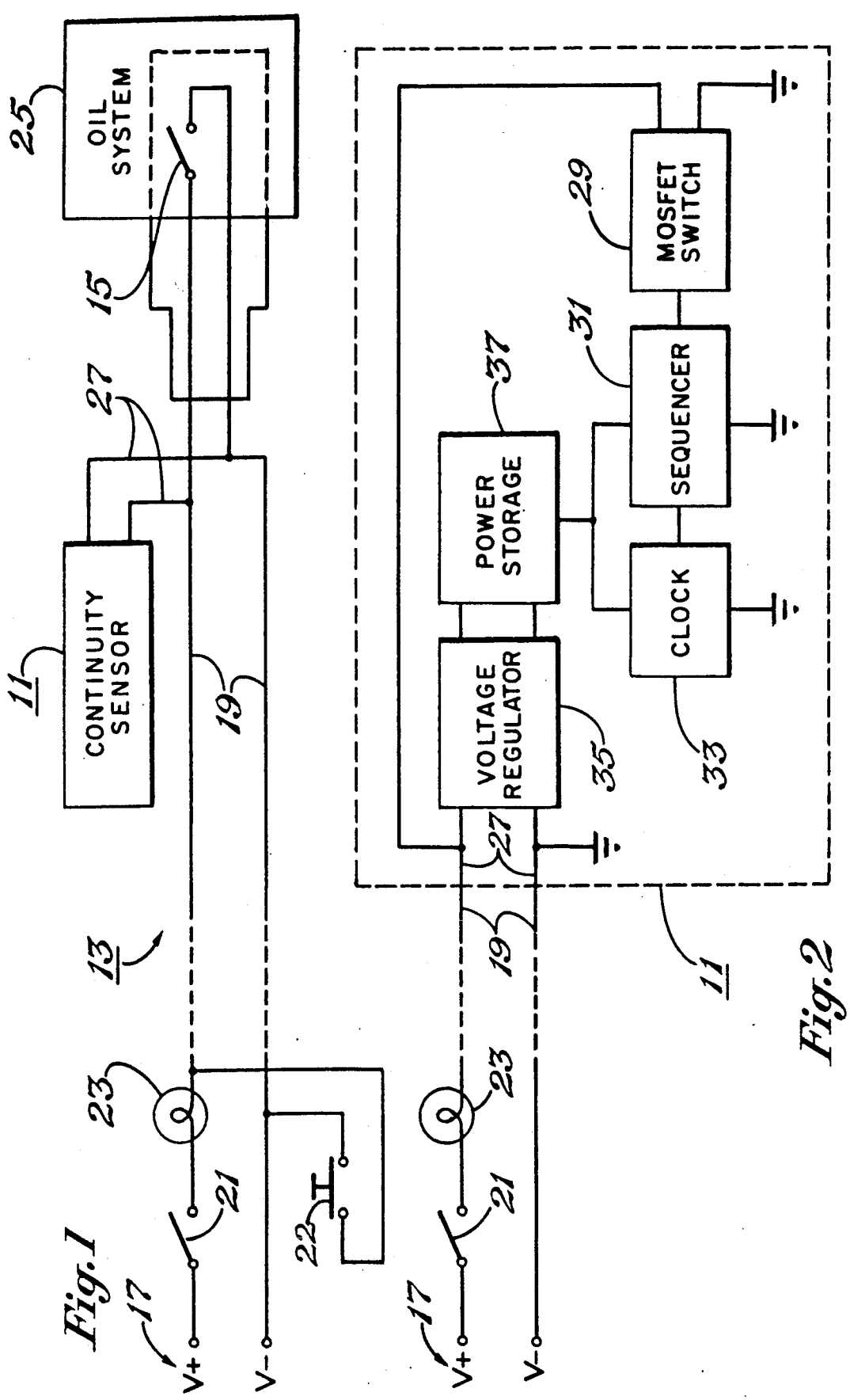

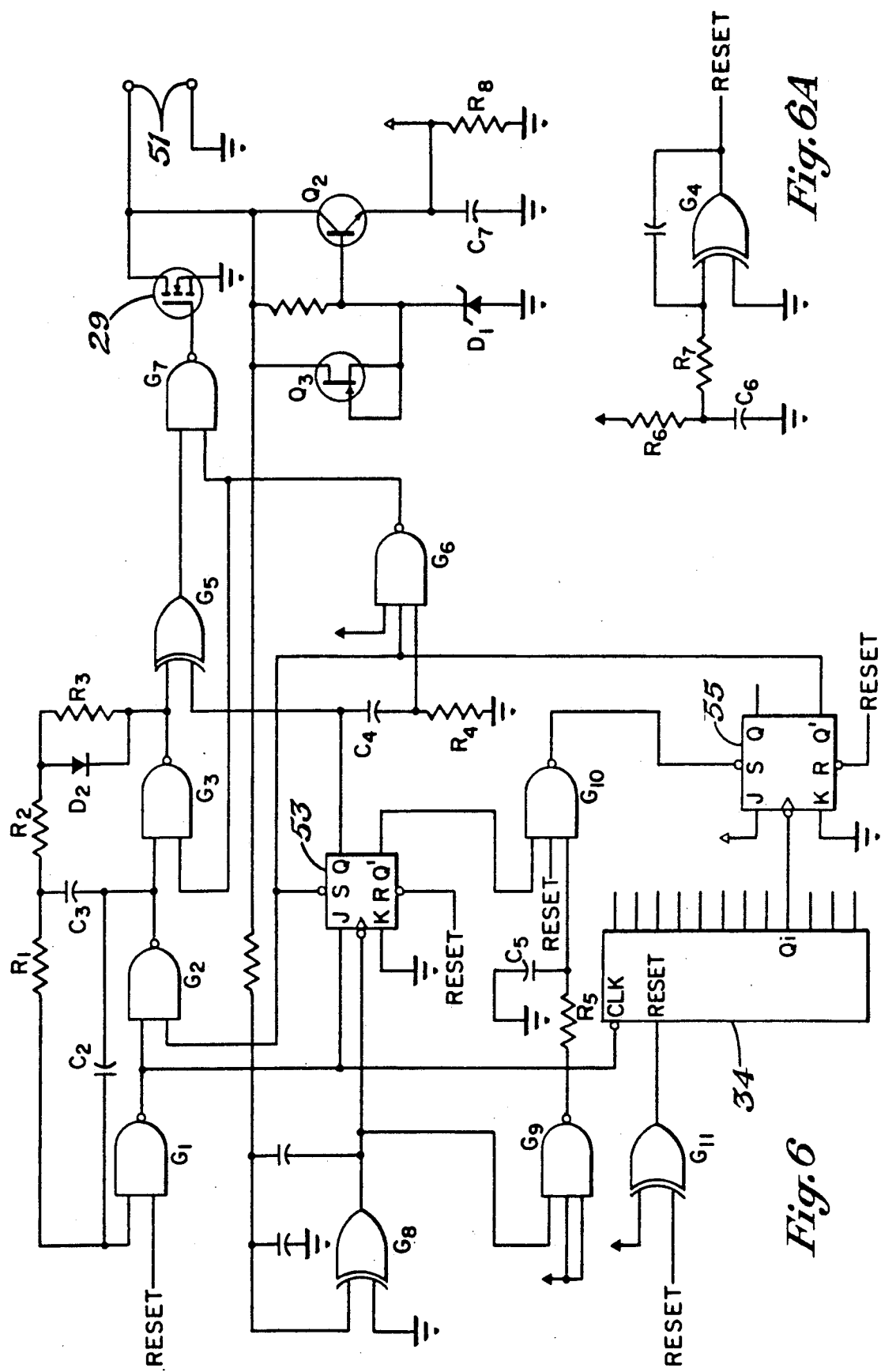

DEVICE FOR SENSING CONTINUITY IN A CIRCUIT HAVING AN OPEN CIRCUITED APPARATUS

FIELD OF THE INVENTION

The present invention relates to devices that sense the continuity of a circuit, which circuit has a remotely mounted open circuited apparatus. Such an open circuited apparatus could typically include a condition detector or a fault detector.

BACKGROUND OF THE INVENTION

The continuity sensor is designed to operate in conjunction with an electrical system consisting of a condition/fault detector and its associated fault indicator. The condition/fault detector is a device which provides an open circuit for normal operation and a closed circuit for a fault condition. The indicator (i.e. warning light, flag, etc.) will turn on in the fault mode as a result of the closed circuit provided by the detector.

The detector is normally mounted remotely with respect to the indicator. The interconnection between them consists of two wires or one wire and a common ground. In aircraft applications, the interconnections typically go through several harnesses, junction boxes, terminal boards, etc.

A typical condition detector in an aircraft application are door closure sensors. They provide an open circuit when the door is properly closed, and a closed circuit when the door is open.

A typical fault detector in an aircraft application are chip detectors used to monitor the health or airworthiness of the engines and gearboxes. Chip detectors employ two conductive zones which are tied to the input leads. The metal chips circulating in the oil system (for engines) or the transmission (for gearboxes) are attracted to the conductive zones by a magnet. An accumulation of the metal chips provides a conductive path across the input leads to complete the circuit.

The operation of the condition/fault detection system depends on the integrity of the interconnections to complete the circuit between the detector and its associated indicator. Should continuity be lost, the detector will not be able to turn the indicator on during the fault mode. Thus, the system has a dormant failure mode wherein the failure of the interconnections gives the same indication as normal operation.

In the prior art, a continuity check of a condition/fault detector system involves two people. In an aircraft installed system, one person sits in the cockpit to close the switch, while the other person physically removes the fault detector from the engine compartment to expose the normally open conductors and shorts across those conductors to complete the circuit. Such a test is impossible to perform when the aircraft is flying. Furthermore, it is undesirable to frequently remove and replace the fault detector for circuit continuity checks as this could lead to error in reinstallation or to damage of the fault detector. What is needed is a device that allows a check of the continuity of the conductors from the cockpit. The device should be simple to connect to an aircraft, requiring no extra conductors.

There is another problem in checking circuit continuity in some condition/fault detection systems. Although an indicator is usually connected to a single condition/fault detector, occasionally an indicator is connected to two or more condition/fault detectors, which are connected in parallel across the indicator. It is desirable to check from the cockpit the continuity of all branches of the circuit, with each branch being checked independently of the other branches.

SUMMARY OF THE INVENTION

It is an object of the present invention to provide a device for testing the continuity of a circuit having an open circuited apparatus, which device permits the testing to be done with one person, without removal of the apparatus.

It is a further object of the present invention to provide a device for testing the continuity of a circuit having an open circuited apparatus, which device requires no extra conductors.

It is a further object of the present invention to provide a system for testing the continuity of a circuit having plural open circuited apparatuses on plural branches.

The device of the present invention senses or tests the continuity of conductors in a circuit. The circuit includes the conductors, detector means, and power source means. The detector means is connected to the power source means by the conductors. The device includes switch means operable between open and closed states, and control means for operating said switch means between said open and closed states. The switch means is adapted to be connected across the conductors at a location near the detector means. The closed state of the switch means is adapted to provide continuity between the conductors. The control means is connected with the switch means. The control means operates the switch means for a predetermined length of time upon the application of power by the power source means. Upon the termination of the predetermined length of time, said control means discontinues the operation of the switch means and the switch means is left in the open state.

In one aspect, the device includes power storage means for storing power from said power source means. The power storage means is connected to the control means and provides the operating power for the control means. The control means operates the switch means between the open and closed states, wherein in the open state, the power storage means charges with power from the power source means. With the power storage means, the device is a two wire device and requires no battery.

In another aspect, the circuit includes an indicator lamp to indicate continuity across the conductors. The switch means is operated such that it is in a closed state for a substantially longer period of time than the switch means is in the open state so that a human cannot perceive a change in the illumination of the lamp as a result of the switch means being in the open state.

In another aspect, the switch means includes a MOSFET transistor and the power storage means includes a capacitor.

The device of the present invention is a two wire device, requiring no additional wires or switches to connect it to the monitoring circuit. This allows for retrofitting into equipment, particularly aircraft. The device is activated to illuminate a lamp when it senses the application of power by the master switch means, and then, after a programmed period of time, deactivates itself and turns off the lamp. Thus, when the operator wants to activate the monitoring circuit, he closes the master switch. The device provides a continuity test for an initial period of time and then deactivates itself to allow the monitoring circuit to monitor the normally open means. The length of the test is programmable.

Furthermore, the device utilizes the power supply of the monitoring circuit, increasing reliability by eliminating the need for separate power supply. Furtherstill, the device illuminates the lamp without causing the lamp to dim or falter, even though the device uses the same power supply as the lamp. The switch means is periodically opened for a short period of time to allow the power storage means to recharge to power the control means. The open state occurs so quickly that the human eye cannot perceive any change in the illumination of the lamp.

In another aspect, the monitoring circuit includes conductors forming plural branches with each branch having a respective detector means. A system for checking the continuity of the conductors includes plural devices for the plural branches, with each device being adapted to be connected to one of the branches. Each device has a switch means which is adapted to be connected between the conductors of the respective branch at a location near the respective detector means. Each of the switch means is operable between open and closed states, with the closed state of the respective switch means being adapted to provide continuity between the conductors of the respective branch. Each of the devices has control means for operating the respective switch means between open and closed states. Each of the respective control means is connected with a respective switch means. One of the devices has a first detecting means for detecting the removal of power from the conductors. The first detecting means is connected to the control means of the respective device. The control means of the other devices operate the respective switch means upon the application of power from the power source means when the respective detector means are in a respective open circuit mode such that the respective switch means are alternated between the open and closed states, with the open state being longer than the closed state. The first detecting means detects the removal of power from the conductors by the respective switch means in the other devices by the switch means being in the closed state. The control means of the device having the first detecting means, when the first detecting means detects the closed state, operates the respective switch means of the device having the first detecting means such that the respective switch means is in the closed state for a prolonged predetermined period of time. The control means of the device having the first detecting means causes the switch means to switch to the open state after the predetermined period of time.

By providing a device on each branch of a monitoring circuit having plural branches, the continuity of all of the conductors can be checked. The devices communicate with each using handshake detecting means to ensure that each device senses continuity on its respective branch. When all of the devices sense continuity on all of the branches, one device provides continuity by closing its switch means, thereby illuminating a lamp. The device turns itself off after a predetermined period of time, thereby turning off the lamp. In the meantime, the other devices that are not operating the lamp turn themselves off.

BRIEF DESCRIPTION OF DRAWINGS

FIG. 1 is an electrical schematic diagram of a circuit having an open circuited fault detector, shown with the device of the present invention, in accordance with a preferred embodiment.

FIG. 2 is an electrical schematic block diagram of the device of FIG. 1.

FIG. 6 is an electrical schematic diagram of the device of FIG. 5.

FIG. 6A is an electrical schematic diagram of the reset gate used in conjunction with the circuit shown in FIG. 6.

DESCRIPTION OF PREFERRED EMBODIMENTS

Figures 3, 4:
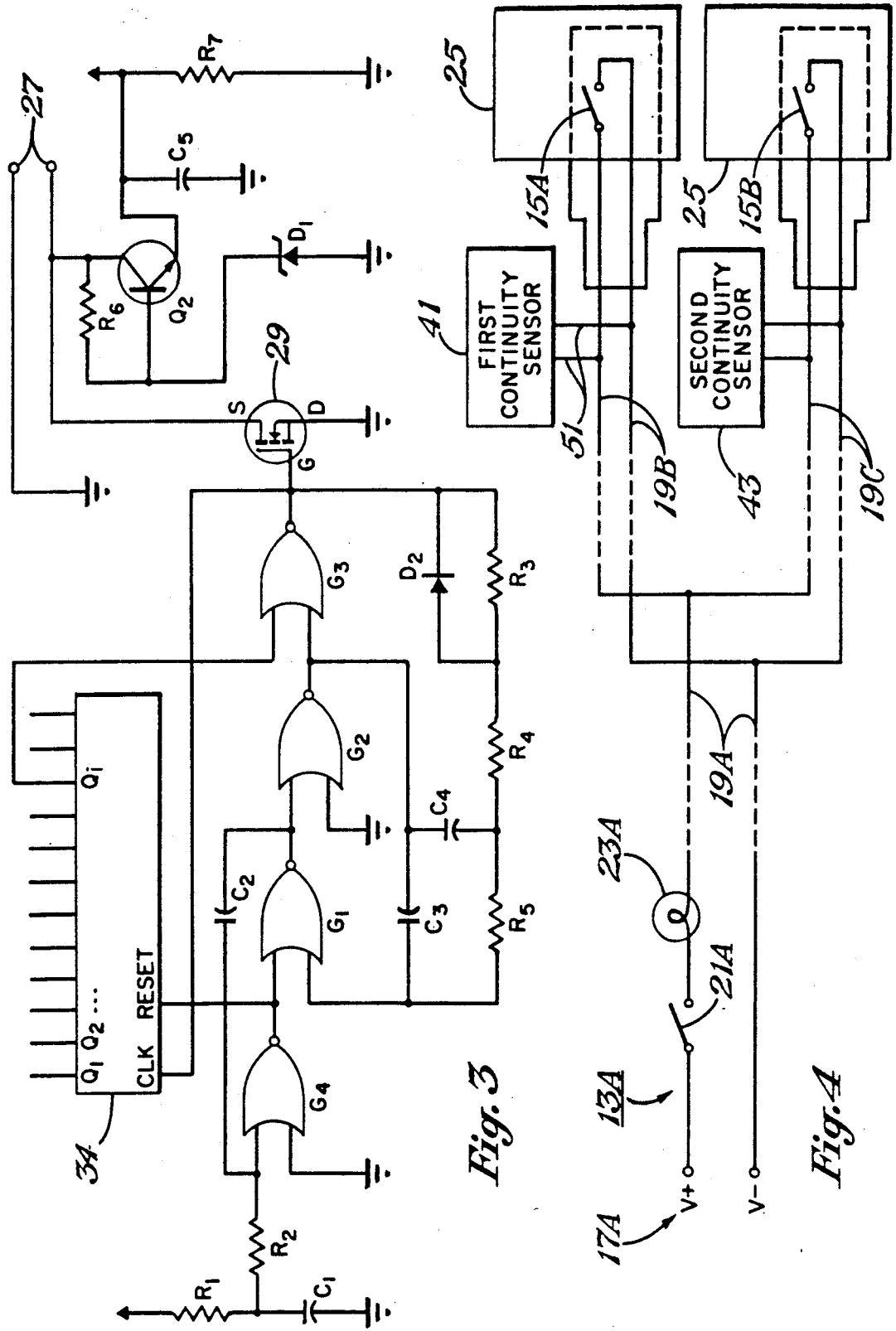
FIG. 3 is an electrical schematic diagram of the device of FIG. 2.
FIG. 4 is an electrical schematic diagram of a circuit having plural open circuited fault detectors, shown with the device of the present invention, in accordance with another embodiment.
Figure 5:
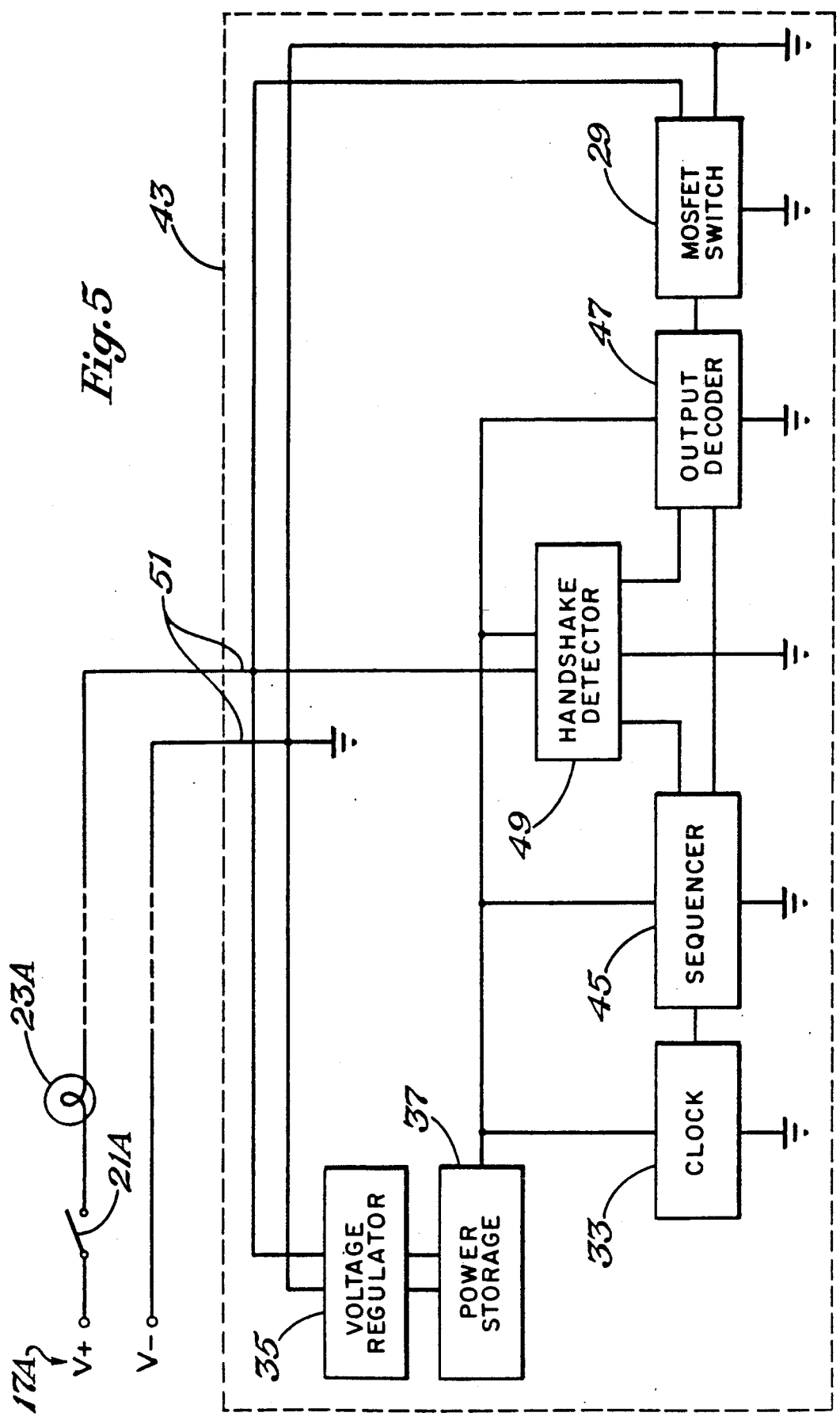
FIG. 5 is an electrical schematic block diagram of the device of FIG. 4.

In FIG. 1, there is shown an electrical schematic diagram of the device 11 of the present invention connected with a monitoring circuit 13. The conventional monitoring circuit 13 has an open circuited condition/fault detector 15 which is used to monitor the operational status of a piece of equipment. In addition to the open circuited detector 15, the monitoring circuit 13 includes power source means 17, conductors 19, master switch means 21, and indicator means 23.

In the preferred embodiment, the open circuited condition/fault detector is a fault detector 15 located in the oil system 25 of an aircraft engine, the master switch means is a master switch 21, and the indicator means is an indicator lamp 23. Thus, the circuit 13 monitors the operation of the engine. The fault detector 15 has an open circuited mode and a closed circuited mode. The fault detector 15 is provided with electrical power by the power source means 17 by way of the conductors 19. The conductors 19 include wires that typically go through several harnesses, junction boxes, and terminal boards. The power source means 17 (shown as a voltage) is connected in series with the master switch 21 and the indicator lamp 23, both of which are located in the aircraft cockpit. The fault detector 15 is located in the engine compartment. The conductors 19 extend from the cockpit to the engine compartment.

To operate the circuit 13 the master switch 21 is closed. With the fault detector 15 in its open circuited mode, the fault detector is open and no continuity is provided; the indicator lamp 23 remains off. The fault detector 15 detects the presence of metal chips or particles in the oil system 25 of the aircraft engine. An accumulation of metal chips across its contacts will cause the fault detector 15 to enter its closed circuited mode, wherein the circuit 13 becomes closed at the fault detector 15, illuminating the lamp 23 and thus indicating the existence of an engine malfunction.

Because of the importance of detecting engine malfunctions, it is desirable to test the operability of the circuit 13. This includes testing the continuity of the conductors 19 connecting the master switch 21 and the lamp 23 to the fault detector 15.

Referring to FIGS. 1-3, the device 11 of the present invention tests the operability of the circuit, including the operability of the lamp 23 and the continuity of the conductors 19. The device 11 is a two wire device, having only two wires 27 or inputs for connection to the two conductors 19. Upon the application of power to the circuit 13 by the master switch 21 or some other means, the device 11 provides continuity across the conductors, causing the lamp 23 to illuminate. Then, after a predetermined period of time, the device 11 removes the continuity from across the conductors, causing the lamp 23 to turn off. Because the continuity of the conductors 19 is to be tested, the device 11 is connected as close as possible to the fault detector 15 to allow testing of the entire length of the conductors 19. The inputs 27 are connected to the conductors 19.

The device of the present invention includes switch means 29, a sequencer 31, a clock 33, a voltage regulator 35, and power storage means 37. In the preferred embodiment, the switch means is a MOSFET transistor 29. The source S and the drain D of the transistor 29 are connected to the respective device inputs 27. The gate G of the transistor 29 is connected to the output of the sequencer 31.

The clock 33 produces a train of pulses having a long duty cycle. The output of the clock 33 is connected to the gate of the transistor 29 through the sequencer 31. The sequencer 31 controls the output of the clock 33, as applied to the transistor gate. The clock 33 is made up of three NOR gates $G_1$, $G_2$, $G_3$ which are connected as follows: one of the inputs of the gate $G_1$ is connected to the output of a reset gate $G_4$. The other input of the gate $G_1$ is connected, through capacitors $C_3$, $C_4$, and a resistor $R_5$, to the output of the gate $G_2$. The output of gate $G_1$ is connected to an input of the gate $G_2$, and to an input of the reset gate $G_4$ through a capacitor $C_2$. The other input of the gate $G_2$ is connected to ground. The output of the gate $G_2$ is connected to gate $G_1$, as described, and to an input of the gate $G_3$. The output of the gate $G_3$ is connected to the gate of the transistor 29 and to diode $D_2$ and resistors $R_3$ and $R_4$. Resistor $R_4$ is connected to resistor $R_5$ and capacitor $C_4$.

The sequencer 31 is made up of a counter 34 and gate $G_3$. The other input of the gate $G_3$ is connected to the ith bit of the counter 34 output. The ith bit determines the duration of the test. For a longer test, a larger ith bit is used. In the preferred embodiment, a test of about 15 seconds is provided by using the tenth bit, which indicates a count of 512. The output of gate $G_3$ is connected to the CLOCK input of the counter 34.

The reset gate $G_4$, also a NOR gate, has an input connected to the voltage regulator and power storage means, via resistors $R_1$ and $R_2$ and capacitor $C_1$. The other input of the reset gate $G_4$ is connected to ground. The output of the reset gate is connected to the gate $G_1$ and to the RESET input of the counter 34.

The voltage regulator 35 is conventional, having a transistor $Q_2$, a resistor $R_6$, and a zener diode $D_1$. The power storage means is, in the preferred embodiment, a capacitor $C_5$ and a resistor $R_7$. In the preferred embodiment, the electronic components utilize CMOS technology to minimize power consumption. The voltage regulator 35 and the capacitor $C_5$ provide a regulated voltage of +5 volts to the gates $G_1$, $G_2$, $G_3$, $G_4$, and to the counter 34. The capacitor $C_5$ is 22 microfarads and the resistor $R_7$ is 330 kilohms.

The operation of the device 11 of the present invention will now be described. In the initial state of the monitoring circuit 13 the master switch 21 is open and in the initial state of the device 11 the capacitors are all discharged. The operator closes the master switch 21 to activate the monitoring circuit 13 and to provide a short test of the circuit with the device 11.

Voltage then appears at the inputs 27 of the device wherein the clock 33 and the sequencer 31 are provided electrical operating power. Capacitor $C_5$ charges quickly, while capacitor $C_1$ charges more slowly (because resistor $R_1$ is 10 megaohms). While capacitor $C_1$ is charging, the reset gate $G_4$ stops the clock 33 through gate $G_1$, and resets the counter 34 at the RESET input. Thus, the reset gate $G_4$ senses the application of power by the master switch 21. After a short period of time, capacitor $C_1$ becomes partially charged and turns off the reset gate $G_4$. The clock 33 then starts to oscillate and generate pulses at the output of gate $G_3$. When the output of gate $G_3$ is high, the transistor 29 is turned on and continuity is provided in the monitoring circuit 13 and the lamp 23 is illuminated. When the output of gate $G_3$ is low, the transistor 29 is turned off, disrupting continuity of the monitoring circuit 13. The clock 33 produces a train of pulses, turning the transistor 29 alternatively on and off.

The transistor 29 is turned off for a brief period of time in order to allow the capacitor $C_5$ to recharge from the power source means 17 of the monitoring circuit 13. The diode $D_2$ causes the output of gate $G_3$ to have a long duty cycle. In the preferred embodiment, the sequencer output of gate $G_3$ has a duty cycle of 29 milliseconds high, 1 millisecond low. Thus, the lamp 23 is turned off for only a brief period of time; so brief that the human eye cannot detect any change in brightness in the lamp and perceives the lamp to be continuously on at full illumination. There is no dimmering or flickering of the lamp 23. Thus, the power storage means "steals" a small amount of power or energy from the power source means 17 over a short and periodic interval of time. The power storage means 37 is able to obtain enough power during the off time of gate $G_3$ to power the electronics during the entire on time of gate $G_3$.

The output of gate $G_3$ is connected to the CLOCK input of the counter 34. Thus, every pulse from gate $G_3$ will advance the counter 34 by one. When the counter 34 reaches 512 counts, the $Q_{10}$ output goes high and stops the clock 33 at gate $G_3$, wherein the transistor 29 is turned off and continuity is disrupted. Thus, after being on for about 15 seconds to show the continuity of the monitoring circuit 13, the lamp 23 is turned off. The monitoring circuit 13, and in particular the fault detector 15, remains energized so as to monitor the oil system 25. Any continuity across the fault detector 15 will illuminate the lamp 23. Thus, any subsequent illumination of the lamp 23 after the device 11 has tested the conductors indicates a fault in the oil system 25, as detected by the fault detector 15.

To retest the monitoring circuit 13, the device 11 is reactivated by first removing power by opening the master switch 21. Power is briefly removed to allow the capacitors to discharge. Then, the master switch 21 is closed and the device 11 operates as described above.

An alternative method of implementing a continuity test with the device is through the utilization of a press-to-test switch 22 (see FIG. 1). Some monitoring circuits 13 are provided with a press-to-test switch 22, which provides a momentary path to ground for testing of the lamp 23. When the press-to-test switch 22 is closed, with the master switch 21 remaining closed, continuity is provided and voltage is removed from the conductors 19. To the device 11, this removal of voltage has the same effect as is caused by opening the master switch 21. When the press-to-test switch 22 is released and reopened, power is reapplied to the inputs 27, and the device then starts a new test sequence. The lamp 23 remains illuminated for the programmed period of time.

An important aspect of the device of the present invention is that the device utilizes two wires 27 in interconnecting to a monitoring circuit. The device can thus be easily retrofitted into existing equipment without the necessity of installing additional wires or switches. The device is activated when it senses the initial application of power by the master switch. After a predetermined period of time, the device automatically deactivates itself, thus freeing the monitoring circuit for its monitoring operation. The predetermined period of time can be programmed by selecting the appropriate $Q_i$ from the counter 34.

Another aspect of the present invention is that the device utilizes the power source means made available by the circuit 13. The absence of an internal power supply inside of the device simplifies maintenance and insures a high degree of reliability, particularly in stressful environments such as aircraft engine compartments. The device is able to charge the power storage capacitor $C_5$ during a brief interval of time, with noticeably affecting the illumination of the lamp. This is particularly important in aircraft applications, where the dim illumination levels of cockpit lamps are used for night flying. Thus, the device avoids any ambiguity in indicating circuit continuity to an operator or pilot.

Another aspect of the present invention is that with the exception of the brief period of time for charging the power storage capacitor $G_5$, the continuity of the conductors is continuously checked. Thus, if an intermittent fault is present, as in for example, a loose wire, there is a greater chance of detecting the fault.

There will now be described another embodiment of the present invention. In FIG. 4, there is shown another monitoring circuit 13A, having first and second fault detectors 15A, 15B. The circuit 13A has a power source means 17A, a master switch 21A, and an indicator lamp 23A. The conductors 19A connect each of the first and second fault detectors 15A, 15B to the power source means 17A, via the master switch 21A and the lamp 23A. The conductors, at some point along their length, form two branch circuits 19B, 19C, with one branch 19B being connected to the first fault detector 15A and the second branch 19C being connected to the second fault detector 15B. The first and second fault detectors 15A, 15B are connected in parallel with respect to each other. When the master switch 21A is closed, the circuit 13A monitors both the first and second fault detectors 15A, 15B. A continuity across either one of the first or second detectors will illuminate the lamp 23A.

It is desirable, when testing the continuity of the conductors, to test each branch 19B, 19C independently of the other branch. Thus, the continuity of all of the conductors can be tested.

There are provided first and second devices 41, 43 or continuity sensors. Each of the first and second devices 41, 43 is a two wire device. Each device is connected as close as possible to the respective fault detector to allow testing of the entire length of the branch conductors.

Referring to FIGS. 4–6A, the first and second devices 41, 43 are substantially similar to each other. As in the device 11 shown in FIGS. 1–3, each device includes a switch means 29, a clock 33, a voltage regulator 35, power storage means 37, and a sequencer 45. In addition, each device includes an output decoder 47 and a handshake detector 49.

The output decoder 47 and the handshake detector 49 allow the first and second devices 41, 43 to communicate with each other over the conductors 19A, 19B, 19C. By communicating with each other, the system formed by the first and second devices 41, 43 senses or tests continuity of all of the conductors. If continuity of all of the conductors is found, one of the first or second devices illuminates the lamp 23A and the other of the first or second devices turns itself off. The device that illuminates the lamp operates as described above, wherein the switch means is in the closed state for a substantially longer period of time than it is in the open state, so as not to perceptibly affect the illumination of the lamp. After a predetermined period of time has elapsed, the operating device turns itself off, and turns off the lamp, wherein the monitoring circuit remains energized to monitor the first and second fault detectors 15A, 15B.

In the preferred embodiment, the switch means is a MOSFET transistor 29. The source S and the drain D of the transistor are connected to the respective device inputs 51. The gate G of the transistor 29 is connected to the output of a NAND gate $G_7$.

The voltage regulator is as described in FIG. 3. A transistor $Q_3$ is connected thereto to provide a regulated current source to bias the transistor $Q_2$. The power storage means is a capacitor $C_7$ and a resistor $R_8$ having the same values as in FIG. 3. In the preferred embodiment, the electronic components utilize CMOS technology to minimize power consumption. The voltage regulator and the capacitor $C_7$ provides a regulated voltage of +5 volts to all of the logic gates, the flip-flops, and the counter 34.

The clock 33 is made up of three NAND gates $G_1$, $G_2$, $G_3$ connected as follows: one of the inputs of the gate $G_1$ is connected to the output of a reset gate $G_4$ (see FIG. 6A). The other input of gate $G_1$ is connected, through resistor $R_1$ and capacitors $C_2$, $C_3$, to the output of gate $G_2$. The output of gate $G_1$ is connected to one of the inputs of gate $G_2$, the J input of a first J-K flip-flop 53 and the CLOCK input of the counter 34. The other input of gate $G_2$ is connected to the Q' output of a second J-K flip-flop 55. The output of gate $G_2$ is connected to one of the inputs of gate $G_3$ and to the output of gate $G_3$ via capacitor $C_3$, resistors $R_2$, $R_3$, and diode $D_2$. The other input of gate $G_3$ is connected to the output of a NAND gate $G_6$. The output of gate $G_3$ is connected to an input of an EXCLUSIVE OR gate $G_5$.

The sequencer 45 is made up of the counter 34, which is just like the counter in FIG. 3.

The output decoder 47 includes the EXCLUSIVE OR gate $G_5$ and a NAND gate $G_7$. One of the inputs of gate $G_5$ is connected to the output of gate $G_3$. The other input of gate $G_5$ is connected to the Q output of the first flip-flop 53. The output of the gate $G_5$ is connected to an input of gate $G_7$. The other input of gate $G_7$ is connected to the output of gate $G_6$. The output of gate $G_7$ is connected to the gate G of the transistor 29.

The handshake detector 49 includes first and second flip-flops 53, 55, and gates $G_6$, $G_8$, $G_9$, $G_{10}$. As described above, the J input into the first flipflop 53 is connected to the output of the gate $G_1$ of the clock 33. The K input is connected to ground. The CLOCK input is connected to the output of the EXCLUSIVE OR gate $G_8$. The R input is connected to the output of the reset gate $G_4$. The S input is connected to the Q' output of the second flip-flop 55. The Q output of the first flip-flop 53 is connected to an input of the gate $G_5$ and to an input of the NAND gate $G_6$, through capacitor $C_4$. The input of the gate $G_6$ is connected to ground through resistor $R_4$. The Q' output of the first flip-flop 53 is connected to an input of the NAND gate $G_{10}$. Referring now to NAND gate $G_6$, a second input is connected to the Q' output of the second flip-flop 55 and a third input is connected to the output of the power storage capacitor $C_7$. The output of gate $G_6$ is connected to the other input of gate $G_7$ and to an input of gate $G_3$. One input of the gate $G_8$ is connected to the ungrounded input 51; the other input of the gate $G_8$ is grounded. The output of the gate $G_8$ is connected to the CLOCK input of the first flip-flop 53 and to one input of gate $G_9$. The other inputs of gate $G_9$ are connected to the output of the power storage capacitor $C_7$. The output of the gate $G_9$ is connected, through resistor $R_5$, to an input of gate $G_{10}$. The same input of gate $G_{10}$ is connected to ground through a capacitor $C_5$. Another input of gate $G_{10}$ is connected to the output of the reset gate $G_4$. Still another input of gate $G_{10}$ is connected to the Q' output of the first flip-flop 53. The output of gate $G_{10}$ is connected to the S input of the second flip-flop 55. The J input of the second flip-flop 55 is connected to the output of the power storage capacitor $C_7$, and the K input is grounded. The clock input is connected to the ith output bit of the counter 34. The R input is connected to the output of the reset gate $G_4$. The Q' output is connected as described above.

The reset circuit, shown in FIG. 6A, is similar to the reset circuit of FIG. 3. An EXCLUSIVE OR gate $G_4$ is used with one input grounded and the other input connected to the output of the power storage capacitor $C_7$ through resistors $R_6$, $R_7$. Capacitor $C_6$ is connected to ground.

The operation of the first and second devices will now be described. When the devices 41, 43 are first energized by the application of power from the power source means 17A, the clock 33 oscillates, producing pulses having a long duty cycle (for example 29 milliseconds on, one millisecond off). When the devices 41, 43 are first energized by the power source means, the pulses are inverted by the output decoder 47. Thus, the devices produce pulses that turn on the transistor 29 for one millisecond and turn off the transistor for 29 milliseconds. These short pulses provide continuity across the conductors 19A, 19B, 19C and are too short to illuminate the lamp 23A. The individual clocks 33 of the respective first and second devices 41, 43 are designed to operate at different frequencies, so that the short pulses for the first device 41 can be detected by the second device 43 (and vice versa), indicating to the receiving device 43 that continuity exists in all of the conductors. When the handshake detector 49 of the second device 43 receives the short handshake signal from the first device 41, the second device 43 closes its switch 29 across the conductors 51, thus signaling to the first device 41 to turn itself off. The second device 43 performs these two functions by providing continuity across the conductors for a relatively long period of time. The handshake detector 49 of the first device 41 receives the turn off signal from the second device 43 and turns itself off. The second device continues to operate, illuminating the lamp and using the power source capacitor $C_7$ to obtain enough operating power. Likewise, the first device 41 can detect the short pulses of the second device 43 and operate the lamp and turn off the second device as described above. If one of the two branches 19B, 19C has a discontinuity, then the respective device will not turn on and will not produce short pulses. The other operating device will continue to produce short pulses until its predetermined operating time extinguishes, wherein it will turn itself off. The lamp will not illuminate, thus indicating a discontinuity.

The operation of the first and second devices will now be described in more detail. In the initial state of the monitoring circuit 13A, the master switch 21A is opened and in the initial state of the first and second devices 41, 43, the capacitors are all discharged. When the master switch 21A is closed, voltage appears at the inputs 51 of each device. Capacitor $C_7$ charges quickly and the reset gate $G_4$ generates a RESET pulse to reset the flip-flops 53, 55, the counter 34, the sequencer 45, and to disable the clock 33 through the gate $G_1$.

After the reset pulse lapses, the clock 33 starts to oscillate, producing pulses with a long duty cycle at the output of gate $G_3$. The output decoder 47 controls the duty cycle of the pulses appearing at the gate G of the transistor 29. When the device is first activated by the master switch 21A, the output decoder 47 inverts the pulses so that the pulses have a short duty cycle. Later, if the respective handshake detector 49 detects a short signal from the other device, the output decoder 47 will output long duty cycle pulses.

In the preferred embodiment, the pulses produced by the clock 33 have a duty cycle of 29 milliseconds high, one millisecond low. The pulses are passed by gate $G_5$, which acts as a noninverting buffer, because the Q output of the first flip-flop 53 is low. The pulses are inverted by gate $G_7$, because the Q' output of the second flip-flop 55 is high and the resistor $R_4$ input to gate $G_6$ is low (after the first flip-flop 53 has been reset and the input to gate $G_6$ reaches a stable condition through capacitor $C_4$ and resistor $R_4$) Thus, the output of gate $G_6$ is high, causing gate $G_7$ to invert the clock 33 pulses. When inverted, the clock pulses have a short duty cycle; one millisecond high, 29 milliseconds low. Thus, the transistor 29 is turned on for one millisecond out of every 30 milliseconds, briefly shorting the respective conductors 19B, 19C. This brief period of time is too short to illuminate the lamp 23A such that a human can perceive it. Thus, a human looking at the lamp 23A will perceive the lamp to be off.

During its one millisecond on time, each device 41, 43 shorts the respective branch 19B, 19C, thereby removing voltage from the other branch. During its 29 millisecond off time, each device looks for the removal of voltage from its branch by the other device. The clocks 33 of the first and second devices 41, 43 are designed to operate as slightly different frequencies, so that one device will be off while the other device is on. The capacitor $C_3$ in the clock of the first device is of a different value (33 nanofarads in the preferred embodiment) than the capacitor $C_3$ (22 nanofarads in the preferred embodiment) in the clock of the second device to insure different operating frequencies. When power is first applied by closing the master switch 21A, both of the clocks in the first and second devices 41, 43 are synchronized. As time progresses however, the clocks will drift apart, so that one device will briefly short across the conductors while the other device is looking for the shorting.

In the event that one of the branches 19B, 19C has a discontinuity, the device that is connected to the discontinuous branch will not be activated by the application of power by the master switch 21A, and consequently will not remove the voltage from the other branch. In this case, the device that is connected to the branch having continuity will activate and short the branch for one millisecond every 30 milliseconds. The lamp 23A will not illuminate, and the counter 34, which counts the oscillations at its CLOCK input, will eventually turn off the clock by causing the CLOCK input into the second flip-flop 55 to go high, thereby causing the Q' output to go low. Thus, the activated device will effectively shut itself off after a programmed period of time. Because the lamp never illuminates, the operator will be alerted to the fact that one of the branches has a discontinuity.

In the event that both branches are continuous, both devices will be activated by the application of power by the master switch 21A. During its 29 millisecond off time, each device will, through its handshake detector 49, be looking for a signal from the other device. The signal, a short removal of voltage, indicates that the other branch has continuity. When the removal of voltage is detected, the detecting device closes its switch 29 across the conductors 51 and causes the other device to shut itself off. Such a removal of voltage is detected as a low signal at the input of gate $G_8$ of the detecting device. The gate $G_8$ passes the negative going signal to the CLOCK input of the first flip-flop 53, causing output Q to go high. The high signal goes to an input of gate $G_6$, through RC network $R_4$, $C_6$ which is a differentiator. With all three inputs to gate $G_6$ temporarily high, the output of gate $G_6$ is low, causing the output of gate $G_7$ to go high and turn on the transistor 29, thereby illuminating the lamp 23A. The low signal of gate $G_6$ also goes to gate $G_3$, where the clock 33 is stopped temporarily. The high Q output of the first flip-flop 53 also goes to an input of gate $G_5$, thereby causing gate $G_5$ to become an inverting buffer. After a short period of time (100 milliseconds in the preferred embodiment) the RC network $R_4$, $C_4$ causes the input of gate $G_6$ to go low, wherein the output of gate $G_6$ is now high. The clock 33 is now able to oscillate once again. The output pulses of gate $G_3$ are inverted twice, by gates $G_5$, $G_7$, wherein the output of gate $G_7$ is a pulse train having a long duty cycle (29 milliseconds high, one millisecond low). Thus, the lamp 23A remains illuminated. During the one millisecond low time period, the power storage capacitor $C_7$ is recharged.

The other device shuts itself off when it detects the prolonged (100 millisecond) low signal on its input 51. The low signal appears at the input of the handshake detector gate $G_8$ of the other device. The gate $G_8$ passes the negative going low signal to the input of gate $G_9$. The output of gate $G_9$, which goes high, is connected to the input of gate $G_{10}$ through the integrator $R_5$, $C_5$. In the preferred embodiment, the time constant of the integrator $R_5$,$C_5$ is chosen such that it will pass only pulses longer than 60 milliseconds. After a short interval of time determined by the time constant of the integrator $R_5$,$C_5$, (wherein the low signal is maintained by the other device which has its switch 29 closed), the input to gate $G_{10}$ connected to resistor $R_5$ goes high, causing the second flip-flop 55 to set, wherein the Q' output goes low. The Q' output is connected to an input of gate $G_2$, and so thereby turns off the clock 33, disables the first flip-flop 53, effectively shutting the device down.

The operating device continues to operate and illuminate the lamp until its counter 34 counts out the programmed number of oscillations, wherein the lamp is turned off as described above. When the lamp is turned off, the circuit remains energized to monitor the condition of the normally open fault detectors 15A, 5B.

Although the device of the present invention has been described in conjunction with a monitoring circuit having two branches, the device of the present invention can be used in a monitoring circuit having three or more branches. Each device in a plural branch monitoring circuit handshakes or communicates with the other devices in the circuit to verify continuity in its respective branch, before the lamp is illuminated.

Although the device of the present invention has been described in conjunction with a normally open fault detector, the device can be utilized with any open circuited apparatus. For example, the device could be utilized with a condition detector which is used to monitor the condition of an aircraft door. When the door is open, the condition detector is closed. When the door is closed, as it should be during flight, the condition detector is open. However, with this type of condition detector, if the indicator is off, either the door could actually be closed, or the door could be open and the circuit is malfunctioning. Thus, the monitoring circuit is susceptible to a dormant failure, which can be detected with the device of the present invention.

Although the device of the present invention has been described in conjunction with an aircraft monitoring circuit, is can also be used with monitoring circuits involved in non-aircraft applications.

The foregoing disclosure and the showings made in the drawings are merely illustrative of the principles of the invention and are not to be interpreted in a limiting sense.

We claim:

1. A device for sensing the continuity of first and second conductor means in a circuit, said circuit comprising detector means connected with indicator means by said first and second conductor means, said detector means having an open circuit mode wherein there is no continuity between said first and second conductor means and a closed circuit mode wherein continuity between said first and second conductor means is established, said indicator means indicating when continuity between said first and second conductor means is established, comprising:

(a) switch means being adapted to be connected across said first and second conductor means at a location near said detector means, said switch means having open and closed states with said closed state of said switch means being adapted to provide continuity between said first and second conductor means when said device is connected to said first and second conductor means, and with said open state of said switch means not providing continuity between said first and second conductor means;

(b) control means for automatically operating said switch means between said open and closed states, said control means being connected with said switch means;

(c) said control means being energized by the application of electrical power to said first and second conductor means, said control means operating said switch means into said closed state when said detector means is in said open circuit mode and electrical power is applied to said first and second conductor means, wherein said indicator means can indicate continuity between said first and second conductor means, and operating said switch means into said open state upon the termination of a predetermined length of time.

2. A device for sensing the continuity of conductors in a circuit, said circuit comprising said conductors, detector means, indicator means and power source means, said detector means being connected with said power source means and with said indicator means by said conductors, said power source means for selectively providing power to said detector means and said indicator means, said detector means having an open circuit mode wherein there is no continuity between said conductors and a closed circuit mode wherein continuity between said conductors is established, said indicator means indicating when continuity between said first and second conductor means is established, comprising:

(a) switch means operable between open and closed states, said switch means being adapted to be connected across said conductors at a location near said detector means, with said closed state of said switch means being adapted to provide continuity between said conductors when said device is connected to said conductors, and with said open state of said switch means not providing continuity between said conductors;

(b) control means for automatically operating said switch means between said open and closed states, said control means being connected with said switch means;

(c) power storage means for storing power from said power source means, said power storage means adapted to be connected with said power source means and connected with said control means, said power storage means providing power to said control means for the operation of said control means;

(d) said control means being energized by said power storage means and operating said switch means for a predetermined length of time when said detector means is in the open circuit mode and when power is applied to said conductors by said power source means, said switch means being operated by said control means such that said switch means is alternately in the closed state to provide continuity between said conductors wherein said indicator means can indicate continuity between said conductors and in the open state to charge said power storage means with power from said power source means, and upon the termination of said predetermined length of time said control means discontinues the operation of said switch means with switch means being in the open state.

3. The device of claim 2 wherein
said control means operates said switch means such that said switch means is in the closed state for a substantially longer period of time than said switch means in in the open state so that a human cannot perceive a change in said indicator means as a result of said switching means being in the open state.

4. The device of claim 3 wherein said switch means comprises a MOSFET transistor and said power storage means comprises a capacitor.

5. The device of claim 2 wherein said indicator means comprises an indicator lamp, said lamp being illuminated when continuity is present across said conductors and power is applied to said circuit by said power source means, wherein:

(a) said control means further comprises oscillator means and counter means;

(b) said oscillator means having an output which is connected with said switch means, said oscillator means having a long duty cycle such that the output of said oscillator means is on for a substantially longer period of time than the output is off, wherein when said control means operates said switch means upon the application of power to said conductors said switch means is correspondingly in the closed state for a substantially longer period of time than said switch means is in the open state, so that said lamp appears to a human to be continuously illuminated and so that a human cannot perceive a change in the illumination of said lamp as a result of said switch means being in the open state;

(c) said counter means being connected to said oscillator means and counting the oscillations produced by said oscillator means, wherein when the count reaches a predetermined number of oscillations, said counter means turns off said oscillator means and said switch means is in the open state.

6. The device of claim 5 wherein said switch means comprises a MOSFET transistor and said power storage means comprises a capacitor.

7. An apparatus for monitoring a piece of equipment, comprising:

(a) detector means located in said equipment;

(b) power source means for providing power to said detector means, said detector means being connected to said power source means by conductors, said detector means having an open circuit mode wherein there is no continuity between said conductors and a closed circuit mode wherein continuity between said conductors is established;

(c) an indicator lamp for indicating when continuity is present across said conductors, said indicator lamp being connected with said detector means by said conductors such that when said detector means by said conductors such that when said detector means is in the closed circuit mode and power is applied by said power source means said lamp is illuminated;

(d) manual switch means for applying power from said power source means to said apparatus, said manual switch means and said lamp being connected with said power source means and said detector means by said conductors;

(e) switch means operable between open and closed states, said switch means being connected across said conductors at a location near said detector means, with said closed state of said switch means providing continuity between said conductors and said open state of said switch means not providing continuity between said conductors;

(f) oscillator means for operating said switch means between said open and closed states, said oscillator means being connected with said switch means;

(g) counter means for counting the oscillations produced by said oscillator means, wherein when the count reaches a predetermined number of oscillations, said counter means turns off said oscillator means, and said switch means is in the open state, said counter means being connected with said oscillator means;

(h) power storage means for storing power from said power source means, said power storage means connected with said power source means and said oscillator means and said counter means, said power storage means providing power to said oscillator means and said counter means for the operation of said oscillator means and said counter means;

(i) said oscillator means operating said switch means between open and closed states upon the application of power from said power source means by said manual switch means, said switch means being operated such that said switch means is alternately in the closed state to provide continuity between said conductors and in the open state to charge said power storage means with power from said power source means, wherein when said switch means is in the closed state, the lamp is illuminated.

8. A system for sensing the continuity of conductors in a circuit, said circuit comprising said conductors, plural detector means and power source means, said plural detector means being connected to said power source means by said conductors, said conductors forming plural branches with each branch having a respective detector means, each of said detector means having an open circuit mode where there is no continuity between said conductors in said respective branch and a closed circuit mode where continuity between said conductors in said respective branch is provided, said power source means for selectively providing electrical power to said circuit, comprising:

(a) plural devices for said plural branches with each device being adapted to be connected to one of said branches;

(b) each device having switch means adapted to be connected between the conductors of the respective branch at a location nearer said respective detector means;

(c) each of said switch means being operable between open and closed states, with said closed state of said respective switch means being adapted to provide continuity between the conductors of the respective branch when said respective device is connected to said conductors of said respective branch and said open state of said respective switch means not providing continuity between the conductors of the respective branch;

(d) each of said devices having control means for operating said respective switch means between said open and closed states, said respective control means being connected with said respective switch means;

(e) one of said devices having first detecting means for detecting the removal of power from said conductors caused by an establishment of continuity across one of the branches of said conductors, said continuity being established by one of said switch means in said other devices being in the closed state, said first detecting means being connected to said control means of said respective device;

(f) said respective control means being energized by the application of electrical power to said conductors by said power source means, said control means of said other devices operating said respective switch means upon the application of power from said power source means when said respective detector means are in a respective open circuit mode such that said respective switch mans are alternated between the open and closed states, wherein said closed state of said respective switch means provides continuity between the respective switch means provides continuity between the conductors of the respective branch, with said open state being longer than said closed state;

(g) said control means of said one device having said first detecting means which, when said first detecting means detects said removal of power from said conductors by one of said switch means in said other devices, operates said respective switch means of said one device having said first detecting means such that said respective switch means is in the closed state for a prolonged predetermined period of time;

(h) said control means of said one device having said first detecting means causing said respective switch means to switch to the open state after said predetermined period of time.

9. The system of claim 8 wherein:

(a) each of said devices has a said first detecting means;

(b) each of said devices has a second detecting means, each of said second detecting means in a device for detecting when one of said switch means in another device is in the closed state for said prolonged determined period of time, said respective second detecting means being connected with said respective control means, wherein said control means in said devices whose second detecting means have detected one of said switch means in the closed state for said prolonged time operates said respective switch means to the open state when said second detecting means detects one of said switch means in the closed state for a prolonged period of time.

10. The system of claim 9 wherein said control means in each of said devices, when operating said respective switch means between said open and closed states such that said open state is longer than said closed state, operates at a unique frequency with respect to said control means in said other device.

11. A system for sensing the continuity of conductors in a circuit, said circuit comprising said conductors, first and second detector means, and power source means, said first and second detector means being connected to said power source means by said conductors, said conductors forming first and second branches, with said first detector means connected to said first branch and said second detector means connected to said second branch such that said first and second detector means are connected in parallel with respect to each other, each of said detector means having an open circuit mode where there is no continuity between said conductors in said respective branch and a closed circuit mode where continuity between said conductors in said respective branch is provided, said power source means for selectively providing power to said first and second detector means, comprising:

(a) a first device having a first switch means adapted to be connected across said first branch of said conductors at a location near said first detector means;

(b) a second device having a second switch means adapted to be connected across said second branch of said conductors at a location near said second detector means;

(c) each of said first and second switch means being operable between open and closed states, with said closed state of said respective first and second switch means being adapted to provide continuity between said respective branch conductors and said open state of said respective first and second switch means not providing continuity between said respective branch conductors;

(d) each of said first and second devices having control means for operating said respective switch means between said open and closed states, said respective control means being connected with said respective switch means;

(e) each of said first and second devices having power storage means for storing power from said power source means, said respective power storage means adapted to be connected with said power source means and being connected with said respective control means, said respective power storage means providing power to said respective control means for the operation of said respective control means, said respective power storage means charges when first and second switch means are in the open state;

(f) said respective control means operating said respective switch means upon the application of power by said power source means such that said respective switch means is alternately in the closed state to provide continuity and in the open state and such that said respective switch means is in the open state for a substantially longer period of time than said respective switch means is in the closed state, said control means of said first device operating said first switch means at a different frequency than said control means of said second device operating said second switch means, each of said control means being energized by said respective power storage means upon the application of power from said power source means, wherein upon the application of power by said power source means, each of said power storage means becomes energized;

(g) said first device having first detecting means for detecting when said second switch means is in the closed state, said first detecting means detecting said second switch means closed state when said first switch means is in the open state, said first detecting means being connected to said control means of said first device;

(h) said control means of said first device, when said first detecting means detects said second switch means closed state, operates said first switch means sure that said first switch means is alternately in the closed state and in the open state, with said first switch means being in the closed state for a substantially longer period of time than said first switch means is in the open state;

(i) said second device having second detecting means for detecting when said first switch means is in the closed state for a substantially longer period of time than in the open state, said second detecting means being connected to said control means of said second device;

(j) said control means of said second device, when said second detecting means detects said first switch means closed state, operates said second switch means such that said second switch means in in the open state.

12. The system of claim 11 wherein said power storage means comprises the capacitor.

13. A device for providing continuity across conductors, said conductors being connected to power source means, said power source means for selectively providing power to said conductors, comprising:

(a) switch means adapted to be connected across said conductors at a remote location from said power source means, said switch means being operable between open and closed states with said closed state of said switch means being adapted to provide continuity across said conductors when said device is connected to said conductors, and with said open state of said switch means not providing continuity across said conductors;

(b) control means for automatically operating said switch means between said open and closed states, said control means being connected with said switch means;

(c) said control means being energized by the application of electrical power to said conductors by said power source means, said control means operating said switch means into said closed state when electrical power is applied to said conductors, and operating said switch means into said open state upon the termination of a predetermined length of time.

14. A device for providing continuity across conductors, said conductors being connected to power source means, said power source means for selectively providing power to said conductors, comprising:

(a) switch means adapted to be connected across said conductors at a remote location from said power source means, said switch means being operable between open and closed states with said closed states of said switch means being adapted to provide continuity across said conductors when said device is connected to said conductors, and said open state of said switch means not providing continuity across said conductors;

(b) control means for automatically operating said switch means between said open and closed states, said control means being connected with said switch means;

(c) power storage for storing power from said power source means, said power storage means adapted to be connected with said power source means by way of said conductors and connected with said control means, said power storage means providing power to said control means for the operation of said control means;

(d) said control means being energized by said power storage means and operating said switch means for a predetermined length of time when power is applied to said conductors by said power source means, said switch means being operated by said control means such that when said switch means is alternately in the closed state to provide continuity between said conductors and in the open state to charge said power storage means with power from said power source means, and upon the termination of said predetermined length of time said control means discontinues the operation of said switch means with said switch means being in the open state.

15. The device of claim 14, further comprising:

(a) an indicator lamp for indicating when continuity across said conductor is established, said lamp being remotely located from said device and being connected to said conductors such that said lamp is illuminated when said switch means is in the closed state and power is applied to said conductors;

(b) said control means further comprises oscillator means and counter means;

(c) said oscillator means having an output which is connected with said switch means, said oscillator means having a long duty cycle such that the output of said oscillator means is on for a substantially longer period of time than the output is off, wherein when said control means operates said switch means upon the application of power to said conductors said switch means is correspondingly in the closed state for a substantially longer period of time than said switch means is in the open state, so that said lamp appears to a human to be continuously illuminated and so that a human cannot perceive a change in the illumination of said lamp as a result of said switch means being in the open state;

(d) said counter means being connected to said oscillator means and counting the oscillations produced by said oscillator means, wherein when the count reaches a predetermined number of oscillations, said counter means turns off said oscillator means and said switch means is in the open state.

16. A system for sensing the continuity of conductors in a circuit, said circuit comprising said conductors, first and second detector means, and power source means, said first and second detector means being connected to said power source means by said conductors, said conductors forming first and second branches, with said first detector means connected to said first branch and said second detector means connected to said second branch such that said first and second detector means are connected in parallel with respect to each other, each of said detector means having an open circuit mode where there is no continuity between said conductors in said respective branch and a closed circuit mode where continuity between said conductors in said respective branch is provided, said power source means for selectively providing power to said first and second detector means, comprising:

(a) a first device having a first switch means adapted to be connected across said first branch of said conductors at a location near said first detector means;

(b) a second device having a second switch means adapted to be connected across said second branch of said conductors at a location near said second detector means;

(c) each of said first and second switch means being operable between open and closed states, with said closed state of said respective first and second switch means being adapted to provide continuity between said respective branch conductors and said open state of said respective first and second switch means not providing continuity between said respective branch conductors;

(d) each of said first and second devices having control means for operating said respective switch means between said open and closed states, said respective control means being connected with said respective switch means;

(e) each of said first and second devices having power storage means for storing power from said power source means, said respective power storage means adapted to be connected with said power source means and being connected with said respective control means, said respective power storage means providing power to said respective control means for the operation of said respective control mean, said respective power storage means charges when first and second switch means are in the open state;

(f) said respective control means operating said respective switch means upon the application of power by said power source means such that said respective switch means is alternately in the closed state to provide continuity and in the open state and such that said respective switch means is in the open state for a substantially longer period of time than said respective switch means is in the closed state, said control means of said first device operating said first switch means at a different frequency than said control means of said second device operating said second switch means, each of said control means being energized by said respective power storage means upon the application of power from said power source means, wherein upon the application of power by said power source means, each of said power storage means becomes energized;

(g) each of said devices having detecting means, each of said detecting means in a respective one device for detecting when said switch means of the other device is in the closed state when said switch means of the one device is in the open state, each of said detecting means being connected with said control means of said respective device;

(h) said control means of said first device, when said detecting means of said first device detects said second switch means closed state, operates said first switch means such that said first switch means is alternately in the closed state and in the open state, with said first switch means being in the closed state for a substantially longer period of time than said first switch means is in the open state;

(i) said control means of said second device, when said detecting means of said second device detects said first switch means such that said second switch means is in the open state.

* * * * *